(12) United States Patent
Xie et al.

(10) Patent No.: US 11,024,539 B2
(45) Date of Patent: Jun. 1, 2021

(54) SELF-ALIGNED CUT PROCESS FOR SELF-ALIGNED VIA PROCESS WINDOW

(71) Applicant: INTERNATIONAL BUSINESS MACHINES CORPORATION, Armonk, NY (US)

(72) Inventors: Ruilong Xie, Niskayuna, NY (US); Chih-Chao Yang, Glenmont, NY (US); Jing Guo, Niskayuna, NY (US); Kangguo Cheng, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/450,112

(22) Filed: Jun. 24, 2019

(65) Prior Publication Data

US 2020/0402852 A1    Dec. 24, 2020

(51) Int. Cl.
*H01L 21/336* (2006.01)
*H01L 21/768* (2006.01)
*H01L 23/522* (2006.01)
*H01L 23/528* (2006.01)

(52) U.S. Cl.
CPC .. *H01L 21/76897* (2013.01); *H01L 21/76816* (2013.01); *H01L 21/76877* (2013.01); *H01L 23/5226* (2013.01); *H01L 23/5283* (2013.01)

(58) Field of Classification Search
CPC .......... H01L 21/76897; H01L 23/5283; H01L 23/5226; H01L 21/76816; H01L 21/76877
See application file for complete search history.

(56) References Cited

U.S. PATENT DOCUMENTS

| | | | |
|---|---|---|---|
| 9,362,165 | B1 | 6/2016 | Bouche et al. |
| 9,478,462 | B1 | 10/2016 | Wang et al. |
| 9,735,029 | B1 | 8/2017 | Chu et al. |
| 9,793,164 | B2 | 10/2017 | Machkaoutsan et al. |
| 2016/0056104 | A1 | 2/2016 | Bouche et al. |
| 2016/0204002 | A1 | 7/2016 | Wallace et al. |
| 2017/0140986 | A1 | 5/2017 | Machkaoutsan et al. |
| 2018/0096932 | A1 | 4/2018 | Xie et al. |
| 2018/0269305 | A1 | 9/2018 | Bao et al. |

OTHER PUBLICATIONS

Liu, "DSA Patterning Options for Logics and Memory Applications", Proceedings of SPIE, Volume 10146, Mar. 2017, 13 pages.

*Primary Examiner* — Robert G Bachner
(74) *Attorney, Agent, or Firm* — Tutunjian & Bitetto, P.C.; James Nock

(57) ABSTRACT

A method for fabricating a semiconductor device includes forming at least one sacrificial via within at least one self-aligned via hole of a base structure, forming a region having a misalignment relative to the at least one sacrificial via by cut patterning, and forming a cut cavity having a geometry for minimizing effects of the misalignment by protecting at least one self-aligned via due to the misalignment.

16 Claims, 10 Drawing Sheets

SELF-ALIGNED CUT PROCESS FOR SELF-ALIGNED VIA PROCESS WINDOW

BACKGROUND

The present invention generally relates to semiconductor devices, and more particularly to self-aligned vias and methods of forming the same.

Photolithography generally involves exposing a photoresist layer to light using one or more masks to form a pattern during semiconductor processing. For example, a pattern can be obtained using cut patterning, which can modify or remove features of a primary or base pattern. The cut patterning can include forming a cut structure (e.g., a metal cut) disposed on dielectric material during back-end-of-line (BEOL) metallization.

SUMMARY

In accordance with an embodiment of the present invention, a method for fabricating a semiconductor device is provided. The method includes forming at least one sacrificial via within at least one self-aligned via hole of a base structure, forming a region having a misalignment relative to the at least one sacrificial via by cut patterning, and forming a cut cavity having a geometry for minimizing effects of the misalignment by protecting at least one self-aligned via due to the misalignment.

In accordance with another embodiment of the present invention, a method for fabricating a semiconductor device is provided. The method includes performing self-aligned patterning and etching on a base structure including at least one trench. Performing the self-aligned patterning and etching further includes forming a first sacrificial layer and a first antireflective coating layer and forming at least one opening corresponding to the at least one trench through the first sacrificial layer and the first antireflective coating layer. The method further includes forming at least one self-aligned via hole within the at least one opening, including removing the first antireflective coating layer, and forming at least one sacrificial via within the at least one self-aligned via hole. Forming the at least one sacrificial via includes removing the first sacrificial layer and forming a second sacrificial layer within the at least one self-aligned via hole by filling the at least one trench with sacrificial material. The method further includes forming a region having a misalignment relative to the at least one sacrificial via by cut patterning. Forming the region includes forming a second antireflective coating layer along the second sacrificial layer, forming a photoresist layer on the second antireflective coating layer, and forming the region within the photoresist layer to a surface of the second antireflective coating layer. The method further includes forming a cut cavity having a geometry for minimizing effects of the misalignment by protecting at least one self-aligned via due to the misalignment.

In accordance with yet another embodiment of the present invention, a semiconductor device is provided. The device includes underlying devices, an interlayer dielectric disposed on the base structure including a cut structure landing region having a positive trench angle, and conductive material disposed on the interlayer dielectric and the base structure. The conductive material includes at least one self-aligned via. The device further includes a cut pillar misaligned on the cut structure landing region such that at least a top edge of the cut structure extends into the self-aligned via region.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

The embodiments described herein provide for semiconductor devices including interconnect structures formed using an optimized self-aligned cut process. For example, in the event of misalignment during cut patterning (e.g., metal cut patterning), the embodiments described herein can be used to form a cut cavity in a manner that reduces problems resulting from the misalignment associated with a self-aligned via formed adjacent to a cut structure formed in the cut cavity. Additionally, the embodiments described herein can improve a self-aligned via process window. As used herein, a process window refers to a range of parameters or conditions for a process that can produce target results and/or yields. For example, a process window can be formed using a relationship between exposure parameters and exposure results. Examples of parameters can include, but are not limited to temperature, radiation intensity, critical dimension, sidewall angles, etc.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher-level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Figure 1:
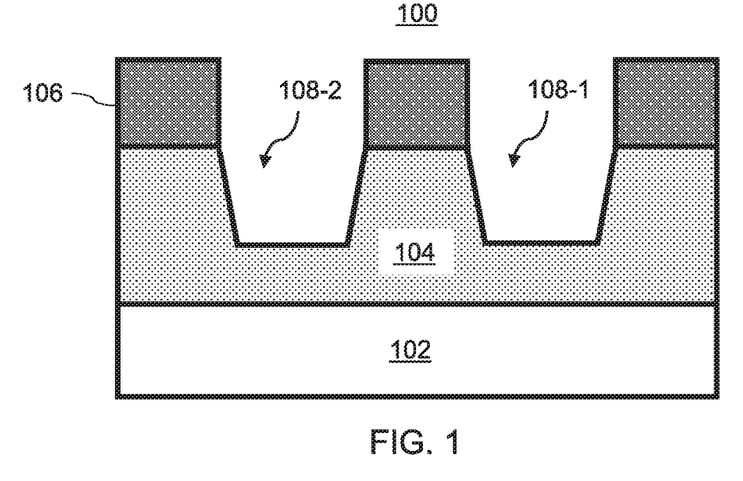
FIG. 1 is a cross-sectional view of trench patterning performed on a stack during the fabrication of a semiconductor device, in accordance with an embodiment of the present invention.

Referring now to the drawings in which like numerals represent the same or similar elements and initially to FIG. 1, a cross-sectional view of a semiconductor device 100 is provided.

As shown, the device 100 includes a base structure 101. The base structure 101 can be patterned from a stack including underlying devices 102, an interlayer dielectric (ILD) 104 and mask material 106 to form trenches, including trenches 108-1 and 108-2. The cross-sectional view of the device 100 in FIG. 1 is thus a transverse cross-sectional view across the device 100.

For example, the underlying devices 102 can include underlying transistors with contacts. As another example, the underlying devices 102 can include underlying conductive material levels below the trenches 108-1 and 108-2.

The ILD 104 can include any suitable material in accordance with the embodiments described herein. For example, the ILD 104 can include, e.g., silicon dioxide ($SiO_2$), low-k dielectrics, ultra-low dielectrics, nitride layers, and combinations thereof.

The mask material 106 can include any suitable material in accordance with the embodiments described herein. In one embodiment, the mask material 106 includes a hardmask material. For example, the mask layer 106 can include, e.g., a silicon nitride material (e.g., SiN), a titanium nitride material (e.g., TiN), an aluminum oxide material (e.g., $AlO_x$), an aluminum nitride material (e.g., AlN) and combinations thereof.

Figure 2:
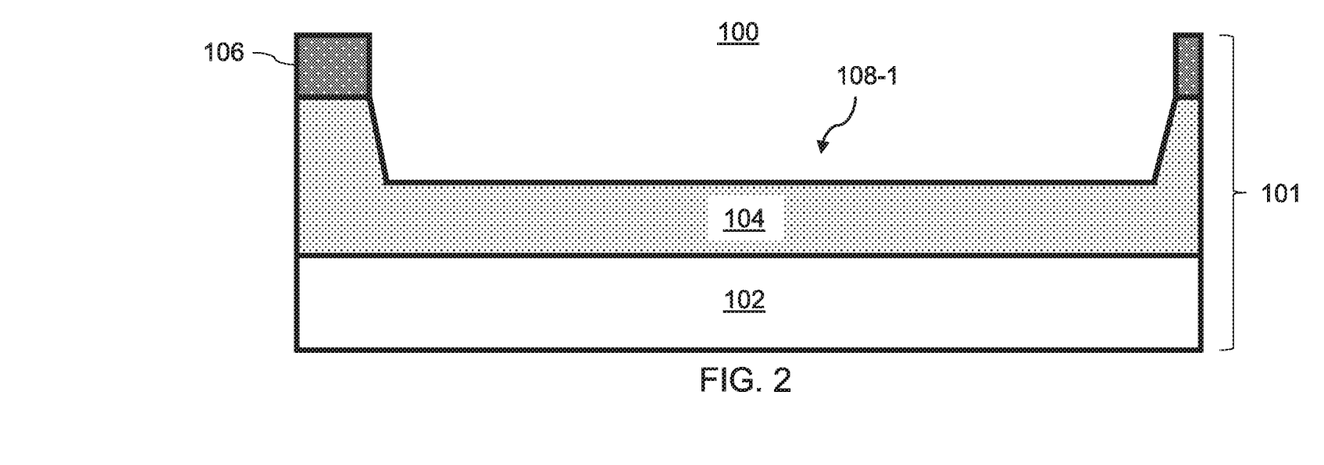
FIG. 2 is a cross-sectional view of the trench patterning performed in FIG. 1 through a given one of the trenches, in accordance with an embodiment of the present invention.

A cross-sectional view of the device 100 longitudinally through the trench 108-1 after the formation of the trenches 108-1 and 108-2 shown in FIG. 1 is provided with reference to FIG. 2.

Figure 3:
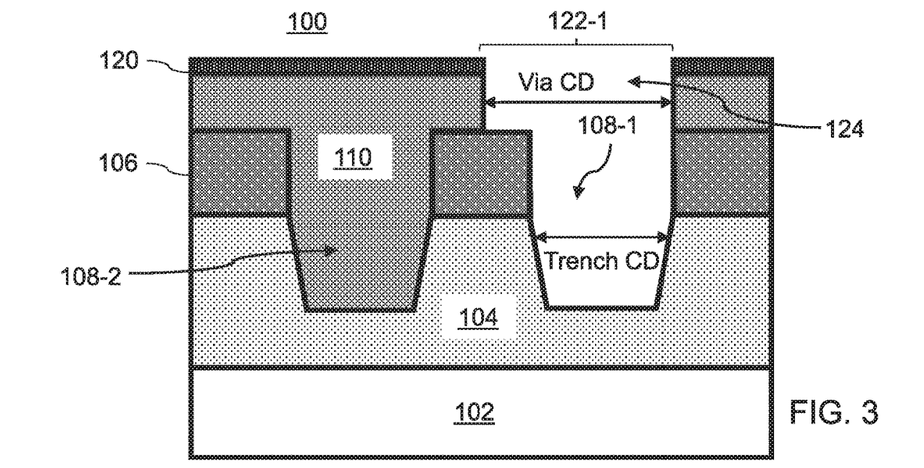
FIG. 3 is a cross-sectional view of self-aligned via patterning performed during the fabrication of the semiconductor device, in accordance with an embodiment of the present invention.

With reference to FIG. 3, a transverse cross-sectional view of the device 100 through the trenches 108-1 and 108-2 is provided showing the performance of self-aligned patterning and etching. More specifically, the base structure 101 can be overfilled with a sacrificial material to form a first sacrificial layer 110, and a first anti-reflective coating (ARC) layer 120 can be formed on the first sacrificial layer 110. Any suitable materials can be used to form the first sacrificial layer 110 and the first ARC layer 120 in accordance with the embodiments described herein. In one embodiment, the first sacrificial layer 110 includes organic planarization layer (OPL) material.

Then, openings including opening 122-1 corresponding to the trench 108-1 can be formed through the first ARC layer 120 and the first sacrificial layer 110 to the surface of the ILD 104. The opening 122-1 includes the trench 108-1 and a via opening 124. The etch process performed to form the opening 122-1 can be selective to the mask material 106. Accordingly, the etch process performed to form the opening 122 can be formed using an etch process that can etch the OPL material selective to the mask material 106.

As further shown, the opening 122-1 defines a "trench CD" which refers to a CD (critical dimension) of the trench 108-1, and a "via CD" which refers to a CD of a via corresponding to the via opening 124. That is, the process shown in FIG. 3 self-aligns the via corresponding to the via opening 124 with the trench 108-1. Accordingly, overlay error can be introduced during the formation of the openings.

Figure 4:
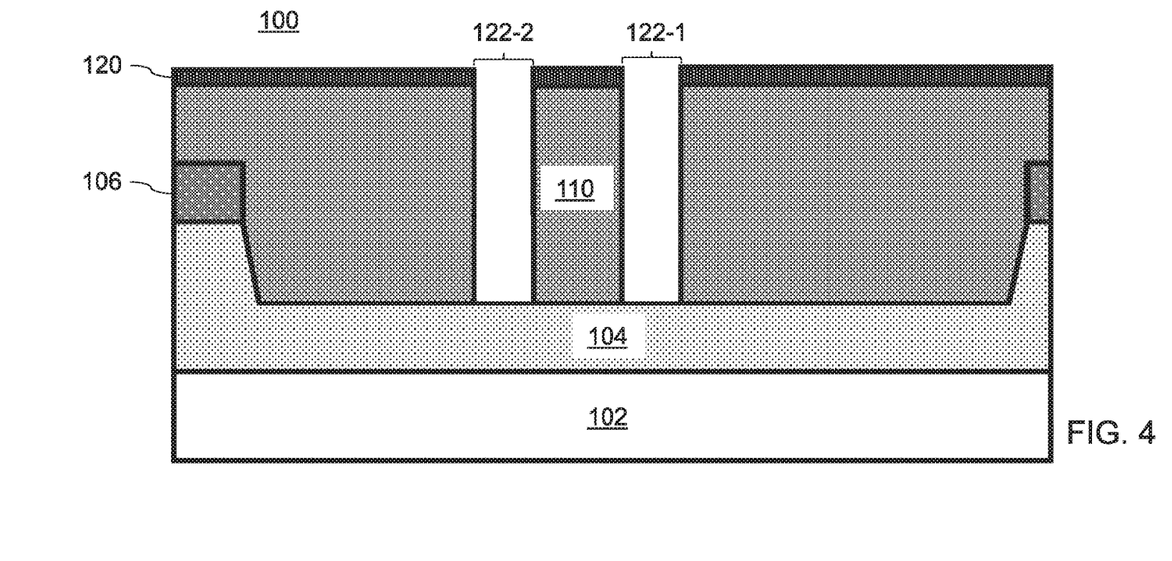
FIG. 4 is a cross-sectional view of the self-aligned via patterning performed in FIG. 3 through the given trench, in accordance with an embodiment of the present invention.

A longitudinal cross-sectional view of the device 100 shown in FIG. 3 through the trench 108-1 is provided with reference to FIG. 4. As shown in FIG. 4, the self-aligned patterning and etching forms openings corresponding to the trench 108-2 including openings 122-1 and an opening 122-2. More specifically, the openings 122-1 and 122-2 can be formed within one or more sacrificial layers formed on the base structure 101 be formed through the first ARC layer 120 and the first sacrificial layer 110 to the surface of the ILD 104. Any suitable process can be used to form the openings 122-1 and 122-2 in accordance with the embodiments described herein. Accordingly, the etch process performed to form the openings 122-1 and 122-2 can be formed using an etch process that can etch the OPL material selective to the mask material 106.

Figure 5:
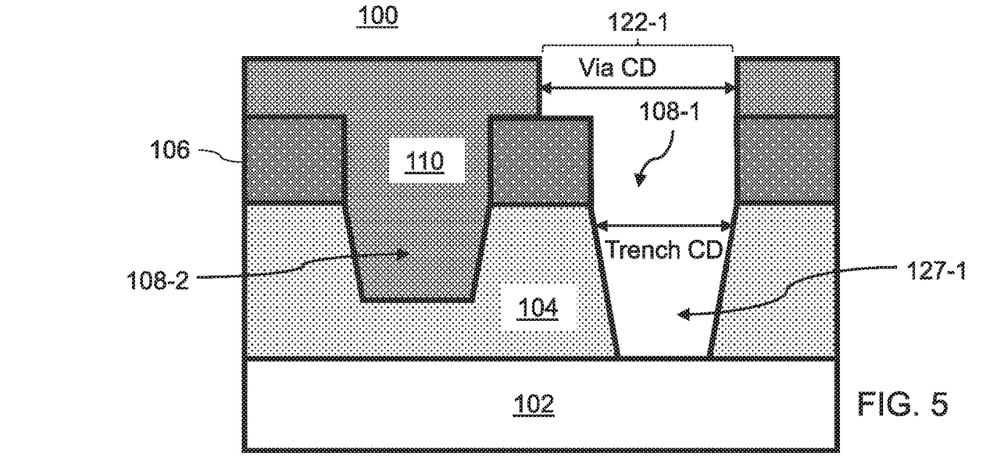
FIG. 5 is a cross-sectional view of the formation of self-aligned via holes during the fabrication of the semiconductor device, in accordance with an embodiment of the present invention.

With reference to FIG. 5, a transverse cross-sectional view of the device 100 through the trenches 108-1 and 108-2 is provided showing the formation of self-aligned via holes within the openings within the ILD 104 to the surface of the underlying devices 102, including self-aligned via hole 127-1 formed within the opening 122-1. In this illustrative embodiment, the first ARC layer 120 is also removed. Any suitable process can be used to form the self-aligned via holes and remove the first ARC layer 120 in accordance with the embodiments described herein. For example, reactive-ion etching (RIE) can be used.

Figure 6:
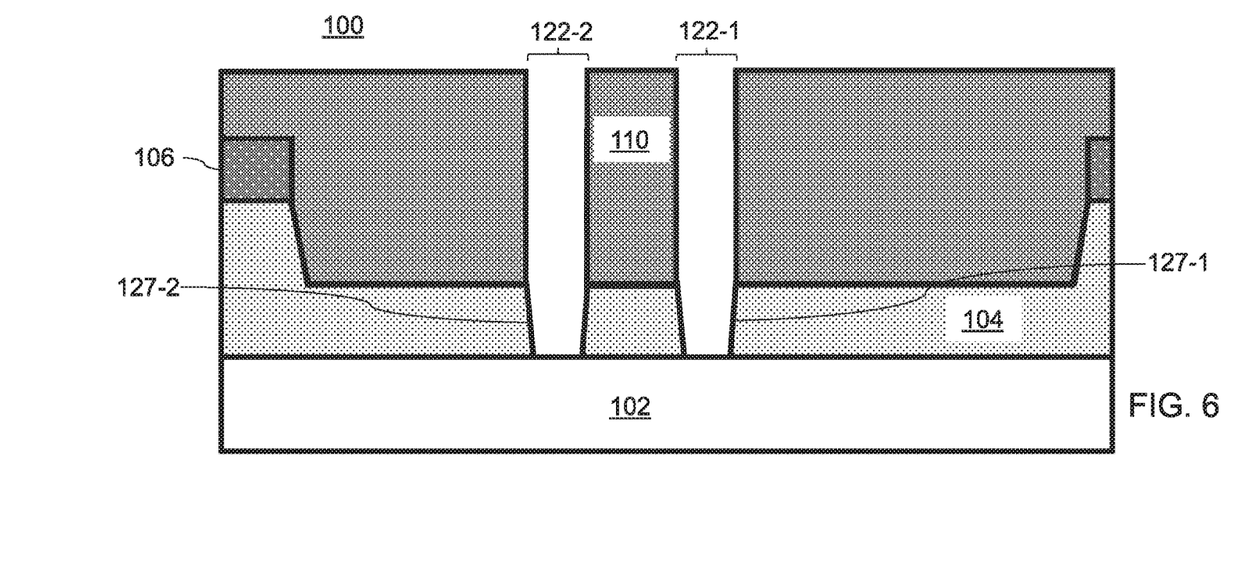
FIG. 6 is a cross-sectional view of the formation of self-aligned via holes performed in FIG. 5 through the given trench, in accordance with an embodiment of the present invention.

A longitudinal cross-sectional view of the device 100 through the trench 108-1 of the device 100 shown in FIG. 5 through the trench 108-2 is provided with reference to FIG. 6. As shown in FIG. 6, self-aligned via holes 127-1 and 127-2 are formed within the ILD 104 to the surface of the underlying devices 102 within the openings 122-1 and 122-2, respectively.

For the sake of simplicity, FIGS. 7-17 provide longitudinal cross-sectional views through the trench 108-1 illustrating additional processing steps for processing the device 100.

Figure 7:
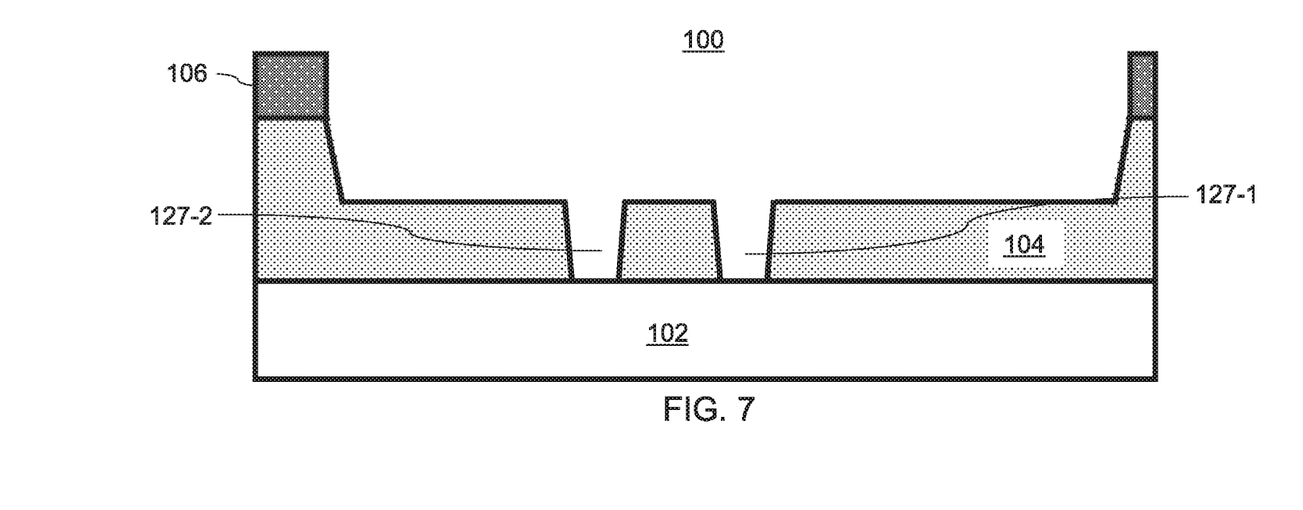
FIG. 7 is a cross-sectional view through the given trench of the removal of a planarization layer used during the self-aligned via patterning during the fabrication of the semiconductor device, in accordance with an embodiment of the present invention.

With reference to FIG. 7, the first sacrificial layer 110 is removed. Any suitable process can be used to remove the first sacrificial layer 110 in accordance with the embodiments described herein. For example, an ash process can be used to remove the first sacrificial layer 110.

Figure 8:
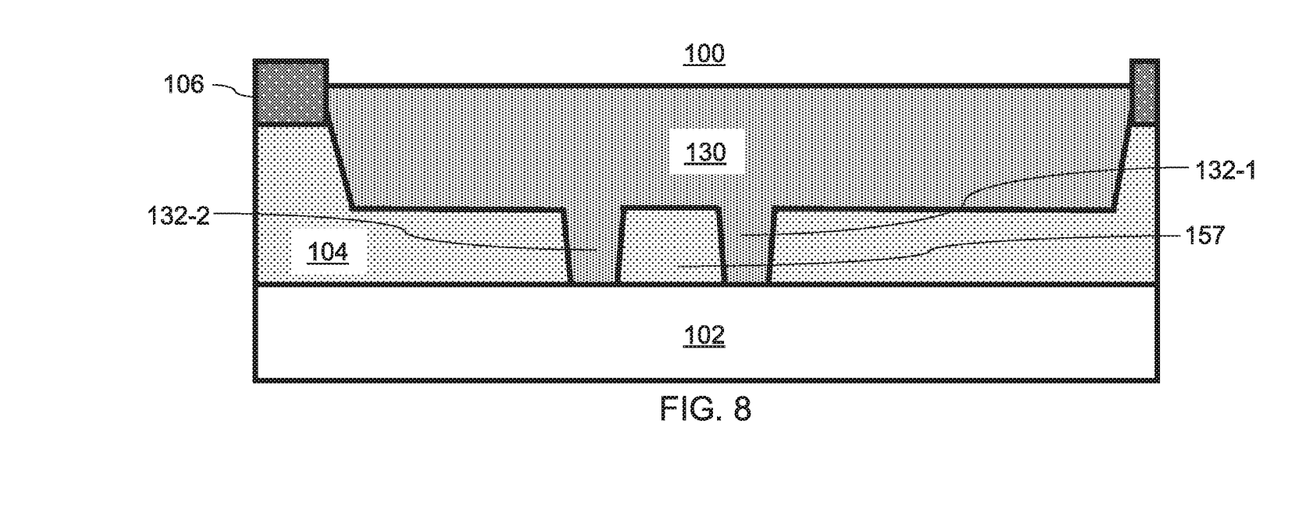
FIG. 8 is a cross-sectional view through the given trench of the formation of a sacrificial layer during the fabrication of the semiconductor device, in accordance with an embodiment of the present invention.

With reference to FIG. 8, a second sacrificial layer 130 is formed on the ILD 104 to form sacrificial vias 132-1 and 132-2 within the self-aligned via holes 127-1 and 127-2, respectively. For example, the second sacrificial layer 130 can be formed by overfilling the ILD 104 with sacrificial material followed by etching back to reveal the top of the mask layer 106. In one embodiment, the second sacrificial layer 130 includes an organic planarization layer (OPL). The material of the second sacrificial layer 130 can include the same or different material from that of the first sacrificial layer 110.

Figure 9:
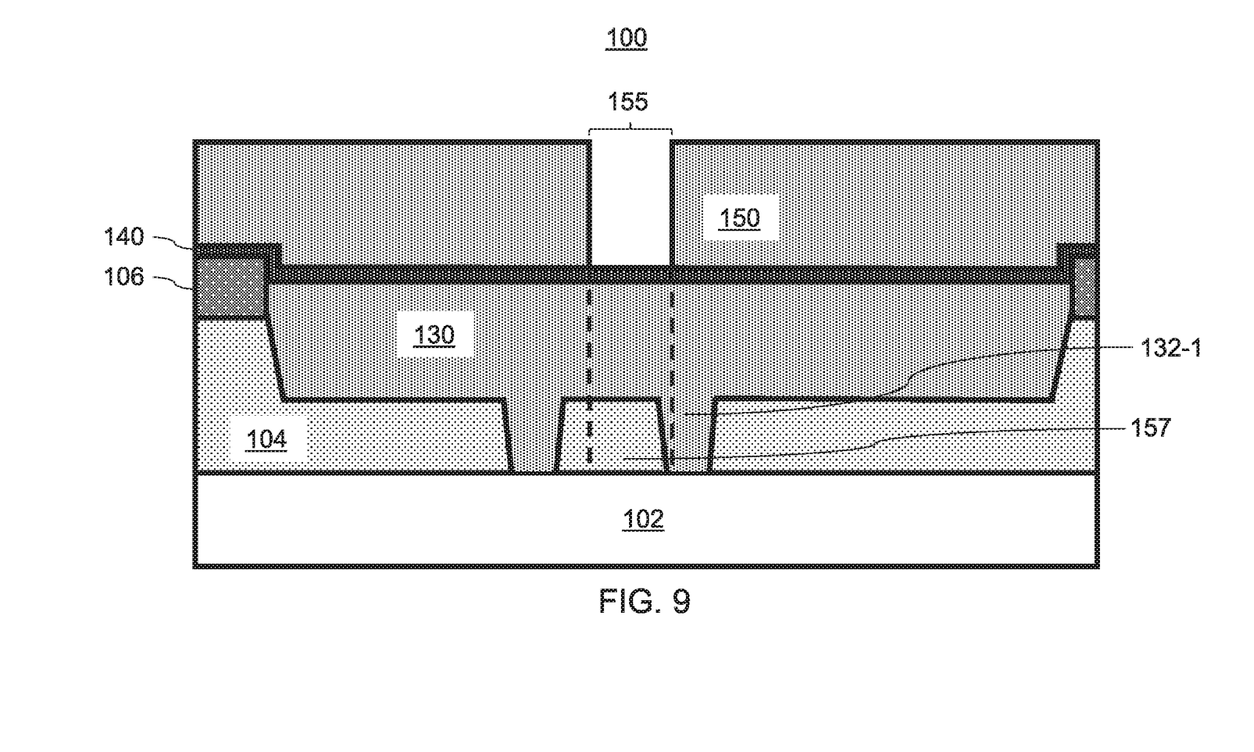
FIG. 9 is a cross-sectional view through the given trench of cut patterning resulting in a misaligned region during the fabrication of the semiconductor device, in accordance with an embodiment of the present invention.

With reference to FIG. 9, cut patterning is performed to form a region 155. Any suitable process can be used to form the region 155 in accordance with the embodiments described herein. For example, as shown, a second ARC layer 140 can be formed along the second sacrificial layer 130 and the mask material 106 (e.g., conformally deposited), a photoresist layer 150 can be formed on the second ARC layer 140, and the region 155 can be formed within the photoresist layer 150 to the surface of the second ARC layer 140. The second ARC layer 140 and the photoresist layer 150 can include any suitable materials in accordance with the embodiments described herein.

As noted by the dashed lines shown in FIG. 9 extending from the sidewalls of the region 155, in this illustrative embodiment, the cut patterning has resulted in the region 155 being misaligned with respect to ILD portion 157. More specifically, as shown, the region 155 has a portion extending above the sacrificial via 132-1. In a case of perfect alignment, the region 155 would be centered with respect to the ILD portion 157, such that region 155 does not extend above the sacrificial via 132-1.

From here, a cut pillar can be formed based on the region 155 in a manner to reduce the effects of the misalignment. A variety of techniques can be used to form the cut pillar such that the cut has a suitable geometry.

For example, FIGS. 10-13 illustrate processing of the device 100 to form a cut cavity having a first geometry in accordance with one embodiment, and FIGS. 14-17 illustrate processing of the device to form a cut cavity having a second geometry in accordance with another embodiment.

Figure 10:
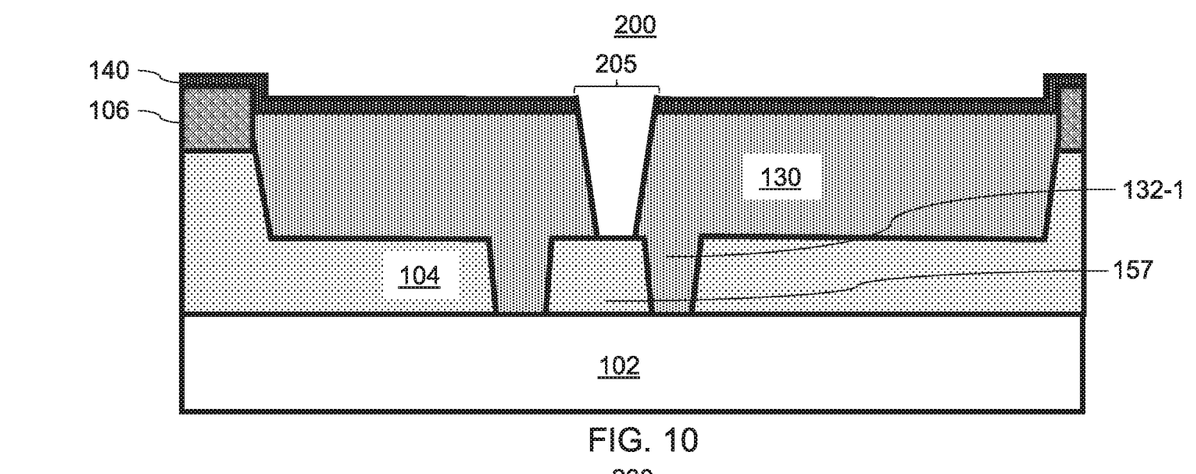
FIG. 10 is a cross-sectional view through the given trench of the formation of a cut cavity based on the misaligned region, in accordance with an embodiment of the present invention.

With reference to FIG. 10, a cross-sectional view of a semiconductor device 200 is provided. The device 200 includes the same components as FIG. 9, except that the photoresist layer 150 is removed and a cut cavity 205 is formed. As shown, the cut cavity 205 can be formed through the second ARC layer 140 and the sacrificial layer to the ILD portion 157. In this illustrative embodiment, the cut cavity 205 lands entirely on the top surface of the ILD portion 157.

The cut cavity 205 is formed in a manner to reduce or eliminate effects associated with the misalignment. For example, the cut cavity 205 can be formed to have a large tapered angle. In an illustrative embodiment, the tapered angle of the cut cavity 205 can have a range from, e.g., about 75 degrees to, e.g., about 87 degrees. The cut cavity 205 can be formed using any suitable process in accordance with the embodiments described herein. For example, the cut cavity 205 can be formed using, e.g., RIE.

Figure 11:
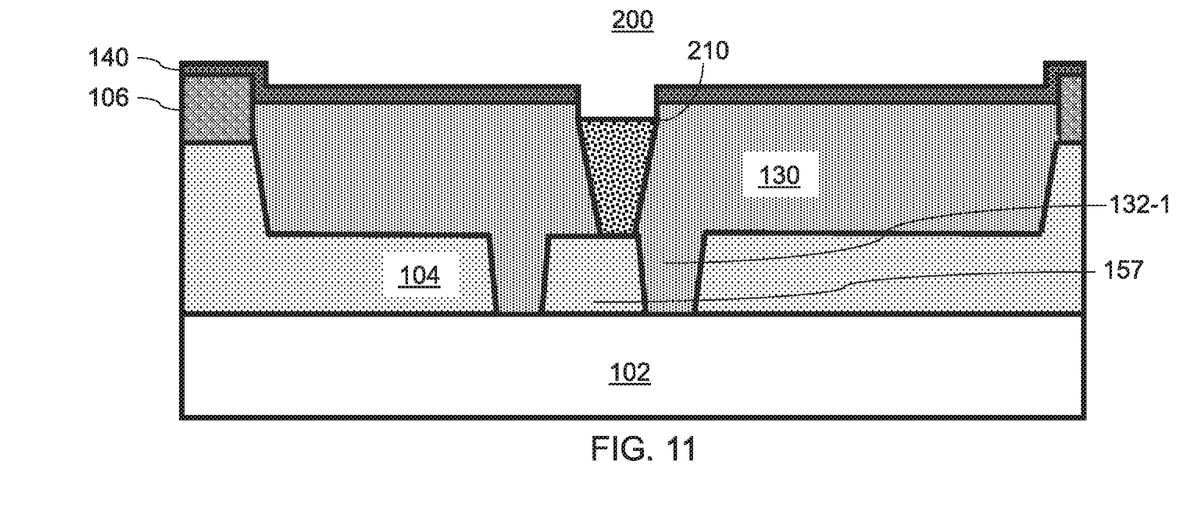
FIG. 11 is a cross-sectional view through the given trench of the formation of a cut within the cut cavity during the fabrication of the semiconductor device, in accordance with an embodiment of the present invention.

With reference to FIG. 11, dielectric material is filled and etched back in the cut cavity 205 to form a cut pillar 210. As shown, a portion of the cut pillar 210 extends above the sacrificial via 132-1.

The cut pillar 210 can be formed using any suitable process in accordance with the embodiments described herein, and any suitable material can be used to form the cut pillar 210 in accordance with the embodiments described herein. For example, a dielectric material can be filled in the cut cavity 205 to form the cut pillar 210. More specifically, a low temperature dielectric material deposition process and etch back process can be used to form the cut pillar 210. Generally, a low temperature dielectric material deposition process can include a deposition process (e.g., chemical vapor deposition (CVD)) performed at a temperature below, e.g., 300° C. For example, a low temperature oxide (LTO) deposition process, a low temperature silicon nitride (e.g., SiN) deposition process or a low temperature aluminum oxide (e.g., $AlO_x$) deposition process can be used to form the cut pillar 210.

Figure 12:
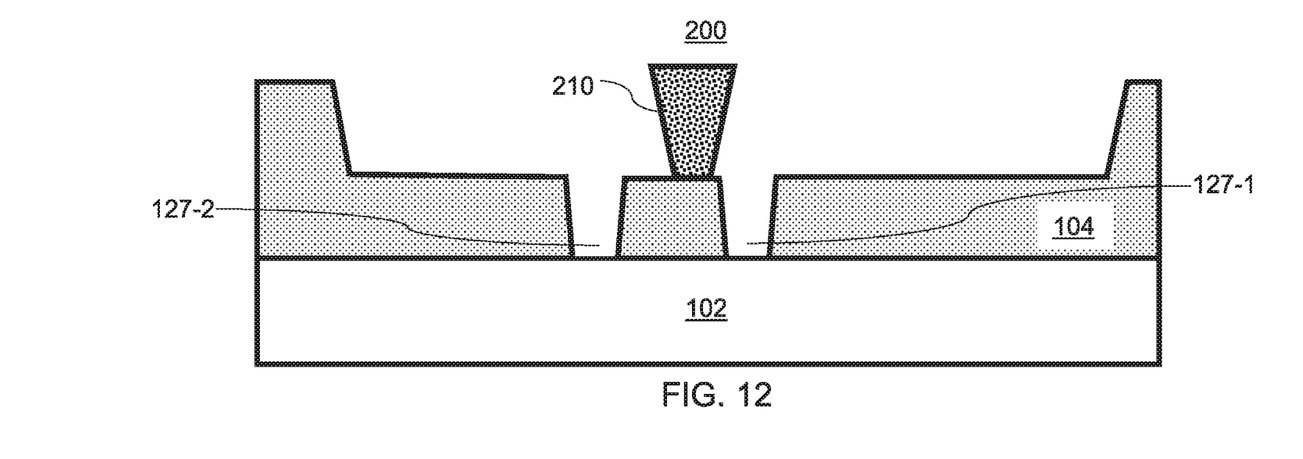
FIG. 12 is a cross-sectional view through the given trench of the removal of material after the formation of the cut, in accordance with an embodiment of the present invention.

With reference to FIG. 12, the second sacrificial layer 130, including the sacrificial vias 132-1 and 132-2, and the second ARC layer 140 are removed, thereby re-forming the self-aligned via holes 127-1 and 127-2. Any suitable process can be used to remove the second sacrificial layer 130 and the second ARC layer 140 in accordance with the embodiments described herein.

Figure 13:
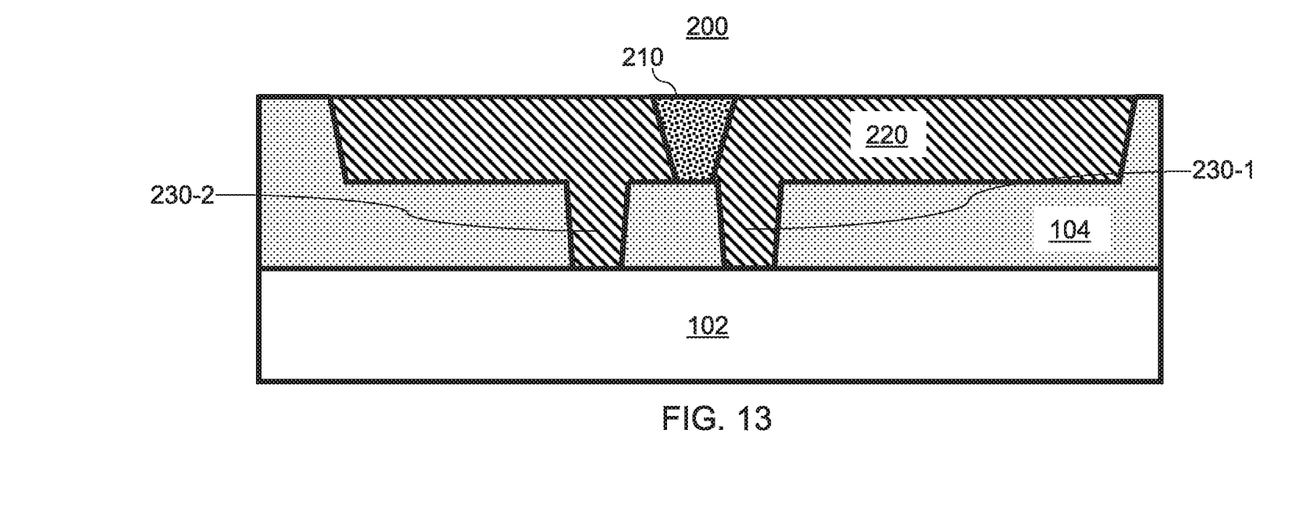
FIG. 13 is a cross-sectional view through the given trench of metallization performed during the fabrication of the semiconductor device, in accordance with an embodiment of the present invention.

With reference to FIG. 13, a conductive material is formed on the device 200 to form a conductive layer 220, and self-aligned vias 230-1 and 230-2 within the self-aligned via holes 127-1 and 127-2 shown in FIG. 12, respectively. Any suitable conductive material can be used to form the conductive layer 220 and the self-aligned vias 230-1 and 230-2.

Examples of suitable conductive materials that can be used to form the conductive layer 220 and the self-aligned vias 230-1 and 230-2 can include, but are not limited to metals, metal alloys, metal nitrides and metal silicides, as well as laminates thereof and composites thereof. For example, the conductive layer 220 and the self-aligned vias 230-1 and 230-2 can include, e.g., tungsten (W), nickel (Ni), titanium (Ti), molybdenum (Mo), tantalum (Ta), copper (Cu), platinum (Pt), silver (Ag), gold (Au), ruthenium (Ru), iridium (Jr), rhodium (Rh), rhenium (Re), aluminum (Al), cobalt (Co), and combinations thereof (e.g., alloys).

In a self-aligned via process, vias are etched only where there is a presence of a conductive material line (e.g., metal line). However, although the cut pillar 210 is not a conductive material line, some portion of the self-aligned via 230-1 is found underneath the cut pillar 210.

As used herein, the term "tip-to-tip region" refers to the region where the conductive material is cut, corresponding to the cut pillar 210, which in this embodiment has a positive trench angle. The tapered angle of the cut pillar 210 protects the self-aligned via 230-1 from undersize or even opening, even with large misalignment. The self-aligned vias 230-1 and 230-2 are self-aligned to the top edge of the conductive material lines, except the tip-to-tip region. The edge of the self-aligned via 230-1 extends beyond the top edge of the conductive material lines, but within a bottom edge of the conductive material lines at the tip-to-tip region.

Figure 14:
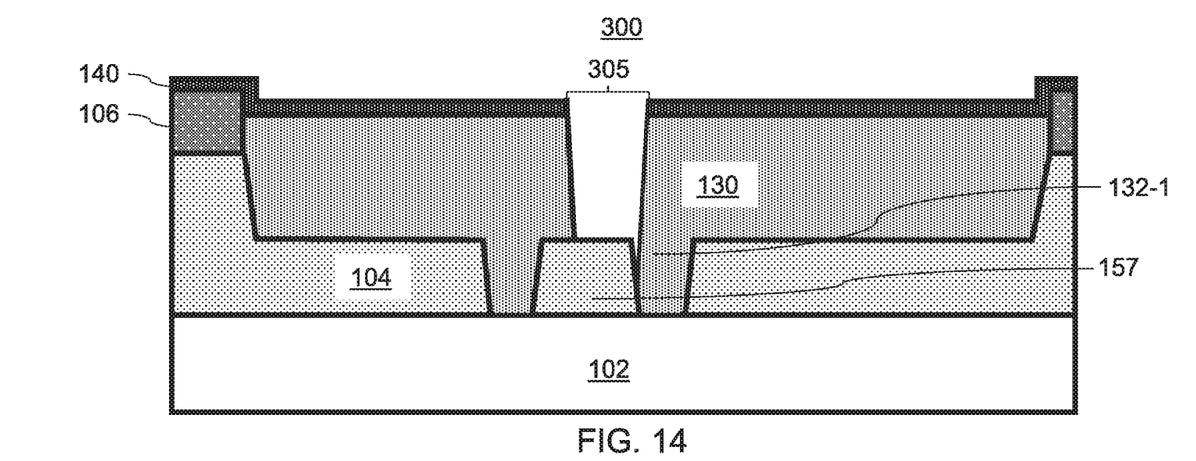
FIG. 14 is a cross-sectional view through the given trench of the formation of a cut cavity based on the misaligned region during the fabrication of the semiconductor device, in accordance with another embodiment of the present invention.

With reference to FIG. 14, a cross-sectional view of a semiconductor device 300 is provided. The device 300 includes the same components as FIG. 9, except that the photoresist layer 150 is removed and a cut cavity 305 is formed. As shown, the cut cavity 305 is formed through the second ARC layer 140 and the sacrificial layer to the ILD portion 157. In this illustrative embodiment, the cut cavity 305 lands on the top surface of the ILD portion 157 and on a sidewall of the ILD portion 157.

The cut cavity 305 is formed in a manner to reduce or eliminate effects associated with the misalignment. For example, the cut cavity 305 can be formed by controlling the tapered angle, such that the cut cavity 305 cuts into the sacrificial via 132-1 with minimum impact. For example, the tapered angle can have a range between, e.g., about 80 degrees to, e.g., about 89 degrees. The cut cavity 305 can be formed using any suitable process in accordance with the embodiments described herein. For example, the cut cavity 305 can be formed using, e.g., RIE.

Figure 15:
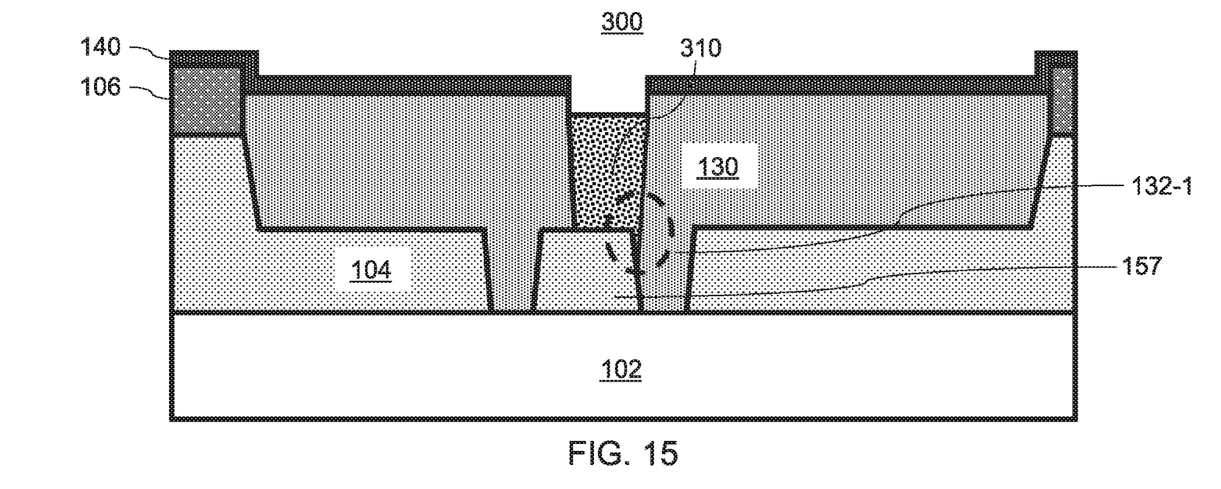
FIG. 15 is a cross-sectional view through the given trench of the formation of a cut within the cut cavity during the fabrication of the semiconductor device, in accordance with another embodiment of the present invention.

With reference to FIG. 15, material is filled in the cut cavity 305 to form a cut pillar 310. As shown, the cut pillar 310 has a portion extending into the sacrificial via 132-1 (as noted by the dotted circle in FIG. 12) as a result of the formation of the cut cavity 305 in FIG. 11.

The cut pillar 310 can be formed using any suitable process in accordance with the embodiments described herein, and any suitable material can be used to form the cut pillar 310 in accordance with the embodiments described herein. For example, a dielectric material can be filled in the cut cavity 305 to form the cut pillar 310. More specifically, a low temperature dielectric material deposition process and etch back process can be used to form the cut pillar 310. Generally, a low temperature dielectric material deposition process can include a deposition process (e.g., chemical vapor deposition (CVD)) performed at a temperature below, e.g., about 300° C. For example, a low temperature oxide (LTO) deposition process, a low temperature silicon nitride (e.g., SiN) deposition process or a low temperature aluminum oxide (e.g., $AlO_x$) deposition process can be used to form the cut pillar 310.

Figure 16:
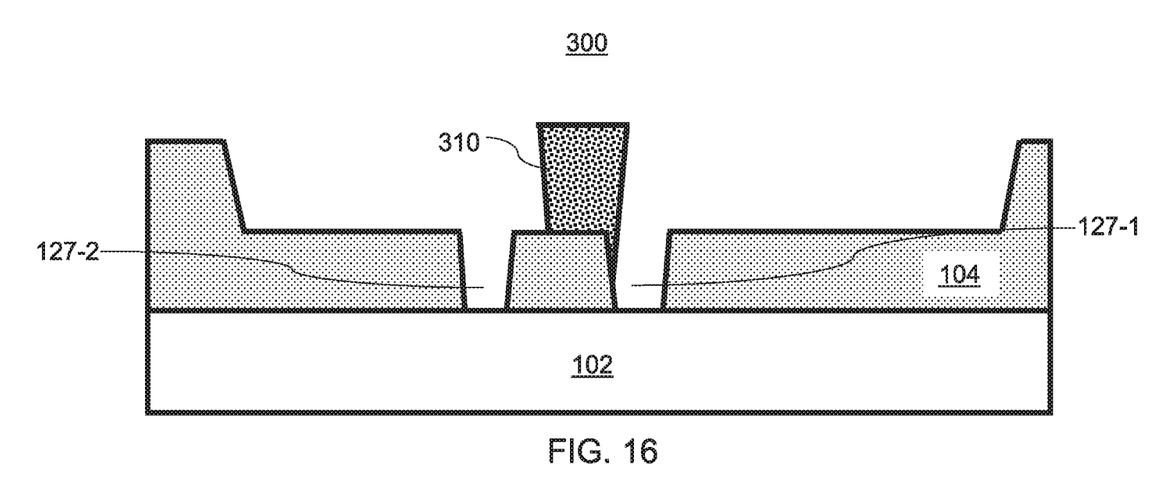
FIG. 16 is a cross-sectional view through the given trench of the removal of material after the formation of the cut, in accordance with another embodiment of the present invention.

With reference to FIG. 16, the second sacrificial layer 130 including the sacrificial vias 132-1 and 132-2 and the second ARC layer 140 are removed, thereby re-forming the self-aligned via holes 127-1 and 127-2. Any suitable process can be used to remove the second sacrificial layer 130 and the second ARC layer 140 in accordance with the embodiments described herein.

Figure 17:
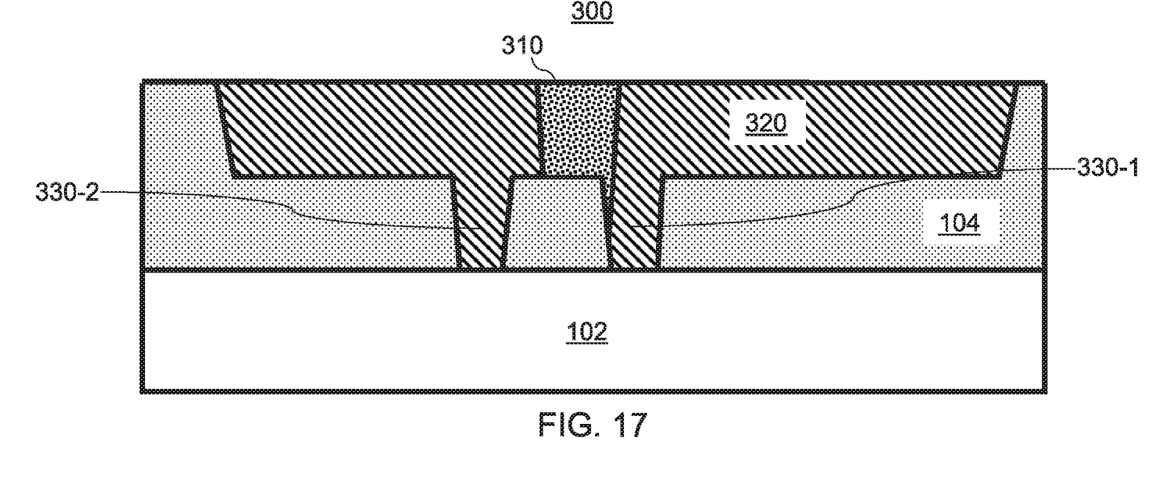
FIG. 17 is a cross-sectional view through the given trench of a metallization process performed during the fabrication of the semiconductor device, in accordance with another embodiment of the present invention.

With reference to FIG. 17, a conductive material is formed on the device 300 to form a conductive layer 320, and self-aligned vias 330-1 and 330-2 within the self-aligned via holes 127-1 and 127-2, respectively. As shown, the cut pillar 310 is partially cut into the self-aligned via 330-2. Any suitable conductive material can be used to form the conductive layer 320 and the self-aligned vias 330-1 and 330-2.

Examples of suitable conductive materials that can be used to form the conductive layer 320 and the self-aligned vias 330-1 and 330-2 can include, but are not limited to metals, metal alloys, metal nitrides and metal silicides, as well as laminates thereof and composites thereof. For example, the conductive layer 320 and the self-aligned vias 330-1 and 330-2 can include, e.g., tungsten (W), nickel (Ni), titanium (Ti), molybdenum (Mo), tantalum (Ta), copper (Cu), platinum (Pt), silver (Ag), gold (Au), ruthenium (Ru), iridium (Jr), rhodium (Rh), rhenium (Re), aluminum (Al), cobalt (Co), and combinations thereof (e.g., alloys).

The tapered angle of the cut pillar 310 protects the self-aligned via 330-1 from undersize or even opening, even with large misalignment. The self-aligned vias 330-1 and 330-2 are self-aligned to the top edge of the conductive material lines, except the tip-to-tip region. The tip-to-tip region includes the cut pillar 310, which has a positive trench angle. The cut pillar 310 includes a portion that partially cuts into the top portion of the self-aligned via 320-1, and ends at the end of the self-aligned via 320-1.

Figure 18:
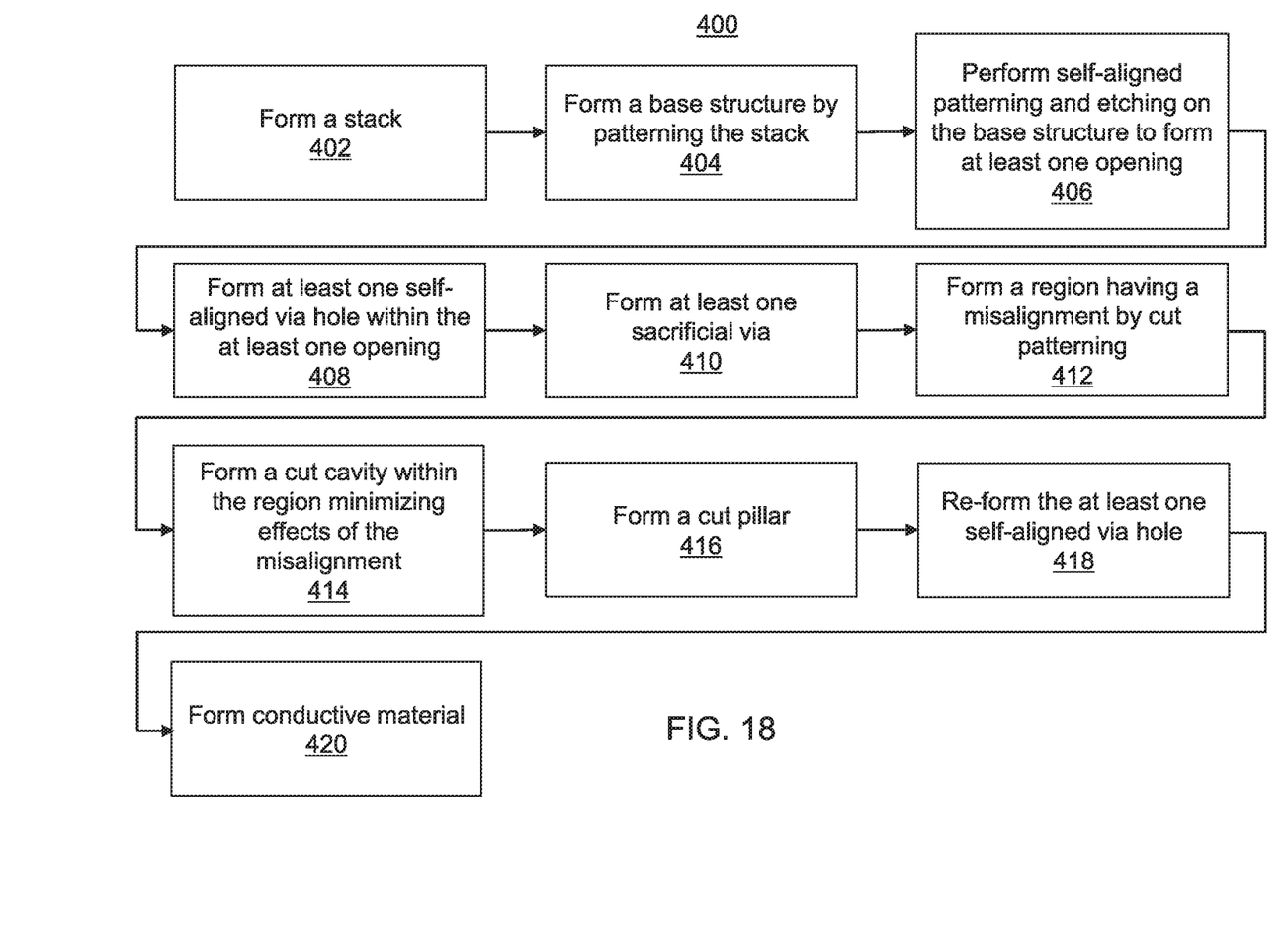
FIG. 18 is a block/flow diagram illustrating a system/method for fabricating a semiconductor device, in accordance with an embodiment of the present invention.

With reference to FIG. 18, a block/flow diagram is shown illustrating a system/method 200 for fabricating a semiconductor device including stacked access device and resistive memory, in accordance with an embodiment.

At block 402, a stack is formed. The stack can include underlying devices, an interlayer dielectric and mask material.

At block 404, a base structure is formed by patterning the stack. The patterning forms at least one trench within the stack. Any suitable process can be used to pattern the stack in accordance with the embodiments described herein.

Further details regarding blocks 402 and 404 are described above with reference to FIGS. 1 and 2.

At block 406, self-aligned patterning and etching are performed on the base structure to form at least one opening. The at least one opening corresponds to the at least one trench, and can include the at least one trench and a via opening. The self-aligned patterning and etching can include filling (e.g., overfilling) the base structure with a sacrificial material to form a first sacrificial layer (e.g., an organic planarization layer (OPL)), forming a first anti-reflective coating (ARC) layer on the first sacrificial layer, and forming the at least one opening corresponding to the at least one trench. The etch process performed to form the at least one opening can be selective to the mask material. Accordingly, the etch process performed to form the at least one opening can be formed using an etch process that can etch the first sacrificial layer selective to the mask material. Any suitable process can be used to perform the self-aligned patterning and etching in accordance with the embodiments described herein. Further details regarding block 406 are described above with reference to FIGS. 3-4.

At block 408, at least one self-aligned via hole is formed. More specifically, the at least one self-aligned via hole is formed within the at least one opening. The at least one self-aligned via hole can be formed within the ILD to the surface of the underlying devices. In one embodiment, the first ARC layer can be removed during or after the formation of the at least one self-aligned via hole. Any suitable process can be used to form the at least one self-aligned via hole in accordance with the embodiments described herein. Further details regarding block 408 are described above with reference to FIGS. 5-6.

At block 410, at least one sacrificial via is formed. More specifically, the at least one sacrificial via is formed within the at least one self-aligned via hole. Forming the at least one sacrificial via can include removing the first sacrificial layer, and forming a second sacrificial layer within the at least one self-aligned via hole by filling the at least one trench. For example, the second sacrificial layer can be formed by overfilling the ILD with sacrificial material and etching back the sacrificial material to reveal the mask material. In one embodiment, the second sacrificial layer can include an organic planarization layer (OPL). The material of the second sacrificial layer can be formed to include the same or different material from that of the first sacrificial layer. Any suitable process can be used to form the at least one sacrificial via in accordance with the embodiments described herein. Further details regarding block 410 are described above with reference to FIGS. 7 and 8.

At block 412, a region having a misalignment is formed by cut patterning. For example, forming the region can include forming a second ARC layer along the second sacrificial layer and the mask material, forming a photoresist layer on the second ARC layer, and forming the region within the photoresist layer to the surface of the second ARC layer. The second ARC layer and the photoresist layer can be formed to include any suitable materials in accordance with the embodiments described herein. Any suitable process can be used to form the region via in accordance with the embodiments described herein. Further details regarding block 412 are described above with reference to FIG. 9.

In a case of perfect alignment, the region can be formed such that the region does not extend above the at least one sacrificial via (e.g., centered with respect to an ILD portion of the base structure). However, the cut patterning performed at block 414 has resulted in the region being formed with a misalignment relative to the at least one sacrificial via. More specifically, the region can have a portion extending above the at least one sacrificial via.

At block 414, a cut cavity minimizing effects of the misalignment is formed within the region. More specifically, the cut cavity can be formed to have a geometry for minimizing the effects of the misalignment. In one embodiment, the cut cavity can be formed to have a first geometry corresponding to a large tapered angle. For example, the first geometry can correspond to a large tapered angle ranging from, e.g., about 75 degrees to, e.g., about 87 degrees. In another embodiment, the cut cavity can have a second geometry formed by controlling the tapered angle, such that the cut cavity cuts into the at least one sacrificial via with minimum impact. For example, the second geometry can be formed by controlling the tapered angle to range from e.g., about 80 degrees to, e.g., about 89 degrees. Any suitable process can be used to form the cut cavity in accordance with the embodiments described herein. Further details regarding block 414 are described above with reference to FIGS. 10 and 14.

At block 416, a cut pillar is formed. For example, the cut pillar can be formed by filling (e.g., overfilling) the cut cavity with a dielectric material, and etching back the cut cavity. However, any suitable process and material can be used to form the cut pillar in accordance with the embodiments described herein. Further details regarding block 416 are described above with reference to FIGS. 11 and 15.

At block 418, the at least one self-aligned via hole is re-formed. For example, re-forming the at least one self-aligned via hole can include removing the second sacrificial layer, including the at least one sacrificial via, and the second ARC layer. Any suitable process can be used to remove the second sacrificial layer and the second ARC layer in accordance with the embodiments described herein. Further details regarding block 418 are described above with reference to FIGS. 12 and 16.

At block 420, conductive material is formed. The formation of the conductive material results in the formation of a conductive layer, and at least one self-aligned via within the at least one self-aligned via hole. Any suitable process and conductive material can be used to form the conductive layer and the at least one self-aligned via in accordance with the embodiments described herein.

The tapered angle of the cut pillar can protect the at least one self-aligned via formed at block 420 from undersize or even opening, even with large misalignment. The at least one self-aligned via is self-aligned to the top edge of the conductive material lines, except the tip-to-tip region. The tip-to-tip region includes the cut pillar, which has a positive trench angle. In the embodiment in which the cut cavity is formed having the first geometry, the edge of the at least one self-aligned via can extend beyond the top edge of the conductive material lines, but within a bottom edge of the conductive material lines at the tip-to-tip region. In the embodiment in which the cut cavity is formed having the second geometry, the corresponding cut pillar can include a portion that partially cuts into the top portion of the at least one self-aligned via, and ends at the end of the at least one self-aligned via.

Further details regarding block 420 are described above with reference to FIGS. 13 and 17.

Having described preferred embodiments of a semiconductor device and a method of fabricating the same (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for fabricating a semiconductor device, comprising:
    forming at least one sacrificial via within at least one self-aligned via hole of a base structure, wherein a pillar is present adjacent the at least one sacrificial via;
    forming a region having a misalignment relative to the at least one sacrificial via by cut patterning, the misalignment of the cut patterning being an opening having a center that is offset from a center of the pillar so that a portion of the opening extends over a sidewall of the at least one sacrificial via; and
    forming a cut cavity within the opening having a tapered sidewall geometry for reducing overlap of the cut cavity to the sidewall of the at least one sacrificial via.

2. The method of claim 1, further comprising:
    forming the base structure to include at least one trench by patterning a stack; and
    performing self-aligned patterning and etching on the base structure to form at least one opening corresponding to the at least one trench.

3. The method of claim 2, wherein the stack includes underlying devices, an interlayer dielectric disposed on the underlying devices, and mask material disposed on the interlayer dielectric, and wherein the at least one trench is formed by etching the mask material and the interlayer dielectric.

4. The method of claim 2, wherein performing self-aligned patterning and etching on the base structure to form at least one opening further includes:
    forming one or more layers including a first sacrificial layer; and
    forming the at least one opening through the one or more layers.

5. The method of claim 4, wherein forming one or more layers further includes forming an antireflective coating layer on the first sacrificial layer.

6. The method of claim 4, wherein forming the at least one sacrificial via further includes:
    forming the least one self-aligned via hole within the at least one opening;
    removing the first sacrificial layer; and
    forming a second sacrificial layer within the at least one self-aligned via hole by filling the at least one trench with sacrificial material.

7. The method of claim 6, wherein forming the region further includes forming an antireflective coating layer along the second sacrificial layer, forming a photoresist layer on the antireflective coating layer, and forming the region within the photoresist layer to a surface of the antireflective coating layer.

8. The method of claim 1, further comprising forming a cut pillar within the cut cavity by filling the cut cavity with a dielectric material.

9. The method of claim 8, further comprising re-forming the at least one self-aligned via hole by removing the at least one sacrificial via, and forming conductive material to form a conductive layer and the at least one self-aligned via within the at least one self-aligned via hole.

10. The method of claim 1, wherein the cut cavity is formed including the tapered sidewall geometry with a tapered angle ranging from about 75 degrees to about 87 degrees.

11. The method of claim 1, wherein the cut cavity is formed by controlling a tapered angle of the cut cavity such that the tapered angle ranges from about 80 degrees to about 89 degrees.

12. A method for fabricating a semiconductor device, comprising:
performing self-aligned patterning and etching on a base structure including at least one trench, including forming a first sacrificial layer and a first antireflective coating layer and forming at least one opening corresponding to the at least one trench through the first sacrificial layer and the first antireflective coating layer;
forming at least one self-aligned via hole within the at least one opening, including removing the first antireflective coating layer;
forming at least one sacrificial via within the at least one self-aligned via hole, including removing the first sacrificial layer and forming a second sacrificial layer within the at least one self-aligned via hole by filling the at least one trench with sacrificial material;
forming a region having a misalignment relative to the at least one sacrificial via by cut patterning, including forming a second antireflective coating layer along the second sacrificial layer, forming a photoresist layer on the second antireflective coating layer, and forming the region within the photoresist layer to a surface of the second antireflective coating layer, the misalignment of the cut patterning being an opening having a center that is offset from a center of the pillar so that a portion of the opening extends over a sidewall of the at least one sacrificial via; and
forming a cut cavity within the opening having a tapered sidewall geometry for reducing overlap of the cut cavity to the sidewall of the at least one sacrificial via minimizing effects of the misalignment by protecting at least one self aligned via.

13. The method of claim 12, further comprising forming the base structure to include the at least one trench by patterning a stack including underlying devices, an interlayer dielectric disposed on the underlying devices, and mask material disposed on the interlayer dielectric, wherein the at least one trench is formed by etching the mask material and the interlayer dielectric.

14. The method of claim 12, further comprising:
forming a cut pillar within the cut cavity by filling the cut cavity with a dielectric material;
re-forming the at least one self-aligned via hole by removing the at least one sacrificial via; and
forming conductive material to form a conductive layer and the at least one self-aligned via within the at least one self-aligned via hole.

15. The method of claim 12, wherein the cut cavity is formed including the tapered sidewall geometry with a tapered angle ranging from about 75 degrees to about 87 degrees.

16. The method of claim 12, wherein the cut cavity is formed by controlling a tapered angle of the cut cavity such that the tapered angle ranges from about 80 degrees to about 89 degrees.

* * * * *